United States Patent
Mantri

(10) Patent No.: US 7,219,276 B2
(45) Date of Patent: May 15, 2007

(54) TESTING CMOS CAM WITH REDUNDANCY

(75) Inventor: Prasad Mantri, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 437 days.

(21) Appl. No.: 10/679,266

(22) Filed: Oct. 7, 2003

(65) Prior Publication Data

US 2005/0076273 A1    Apr. 7, 2005

(51) Int. Cl.
*G11C 29/00* (2006.01)

(52) U.S. Cl. .................. 714/723; 714/718; 714/720; 365/49; 365/201

(58) Field of Classification Search .............. None
See application file for complete search history.

(56) References Cited

U.S. PATENT DOCUMENTS

| | | | | |
|---|---|---|---|---|
| 4,674,090 A * | 6/1987 | Chen et al. | ................. | 714/736 |
| 4,680,760 A * | 7/1987 | Giles et al. | ................. | 714/718 |
| 5,107,501 A * | 4/1992 | Zorian | ................. | 714/720 |
| 6,496,950 B1 * | 12/2002 | Zhao et al. | ................. | 714/718 |
| 6,657,878 B2 * | 12/2003 | Lien et al. | ................. | 365/49 |
| 2005/0050408 A1 * | 3/2005 | Kaginele | ................. | 714/718 |

OTHER PUBLICATIONS

Wright et al., "Transistor-Level Fault Analysis and Test Algorythm Development for Ternary Dynamic Content Addressable Memories", IEEE Test Conference 2003, vol. 1, Oct. 2, 2003, pp. 39-47.*
Patel et al., "Circuits for Low Power Bus Traffic Encoding", Semester Project, located at: http://www.cs.berkeley.edu/~yatish/ee241/ee241_yatish_yurym_projreport.pdf, accessed on Feb. 13, 2006 using Google Search.*
Zhao et al., "Testing SRAM-Based Content Addressable Memories", IEEE Transactions on Computers, vol. 49, No. 10, Oct. 2000.*
J. Zhao et al., "Testing SRAM-Based Content Addressable Memories," *IEEE Transactions on Computers*, vol. 49, No. 10, Oct. 2000.

* cited by examiner

*Primary Examiner*—Albert Decady
*Assistant Examiner*—John P. Trimmings
(74) *Attorney, Agent, or Firm*—Dickstein Shapiro LLP

(57) ABSTRACT

A method for testing an CMOS ternary content addressable memory (TCAM) device includes a match line test to identify stuck match lines, a pull down test to identify weak pull downs (from the match line to ground), and a row-by-row match test. During the row-by-row match test a failed cell can be repaired or the row associated with the failed cell can be disabled. A failed cell or its associated row can also be repaired or disabled, respectively, after the test. Additionally, individual CAM cells which are identified as being defective can be further tested to identify which component of the CAM cell failed.

44 Claims, 8 Drawing Sheets

| FIG. 6B-1 | FIG. 6B-2 |

| FIG. 6B-1 | FIG. 6B-2 |

TESTING CMOS CAM WITH REDUNDANCY

FIELD OF INVENTION

The present invention relates generally to semiconductor memory devices and, more particularly to a method for testing CMOS Ternary Content Addressable Memory (TCAM) devices. The present invention may also be used to test binary content addressable memory (CAM) devices.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM). For example, data is stored in a RAM in a particular location, called an address. During a memory access, the user supplies an address and writes into or reads the data at the specified address.

In a CAM, however, data is stored in locations in a somewhat random fashion. The locations can be selected by an address bus, or the data can be written into the first empty memory location. These data written into the memory location are called as "rules". Every memory location includes one or more status bits which maintain state information regarding the memory location. For example, each memory location may include a valid bit whose state indicate whether the memory location stores valid information, or whether the memory location does not contain valid information (and is therefore available for writing).

In a ternary CAM every bit of data has a Data and Mask bit. Data for a bit is the data that has to be compared for that bit, this data is however qualified by a mask bit which is used as a control bit for each of the data bit to enable or disable it from comparison. When the bit is masked it is called don't care bit. Following table shows a one possible data and mask scheme

| Name | Data | Mask |
|---|---|---|
| No Mask "0" | 0 | 1 |
| No Mask "1" | 1 | 1 |
| Mask "0" | 0 | 0 |
| Mask "1" | 1 | 0 |

Once information is stored in a memory location, it is found by comparing every bit in a memory location with corresponding bits in a comparand register. When the content stored in the CAM memory location does not match the data in the comparand register, a local match detection circuit returns a no match indication. When the content stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which desired data is stored or identification of one of such addresses if more than one address contained matching data. Thus, with a CAM, the user supplies the data and gets back an address if there is a match found in memory. In a ternary CAM when data with mask are stored at various locations and searches are done with a data then for a given data, there is a possibility of multiple rules getting matched for a given key. In a Ternary CAM the process of resolving multiple matches to generate a single match output is called priority resolution. There are many schemes of priority resolution two of the ones are highest order priority or lowest order priority. Highest Priority resolution is where the largest address matched is given out and the lowest order priority is where the smallest address match is given out.

FIG. 1 is a circuit diagram illustrating a conventional SRAM based ternary CAM cell 100. The CAM cell 100 includes a data storage portion 110, which is comprised of an access transistor D0 and a pair of inverters D1a, D1b, arranged in as shown in FIG. 1. The gate of the access transistor D0 is coupled to a word line WL, and one source/drain terminal of the access transistor D0 is coupled to a bit line BL. Thus, a voltage level indicative of a logical value that is placed on the bit line BL is gated across the access transistor D0 when the word line WL is high. This sets the voltage at node D to the voltage equal to the logical value. The two inverter structure D1a, D1b subsequently maintains the logical value at node D and a complement of the logical value at node D#.

A match section 120 of the CAM cell 100 is comprised of transistors M1, M1#, M2, M2# and M3, which controllably couple the match line ML to ground in certain situations. In the CAM cell 100, a "no-match" condition is detected if the match line ML remains at a precharge potential, which a "match" condition is detected if the match line ML is pulled to ground during the match operation. Typically, the detection of the state of the match line ML is performed by a sense amplifier (not illustrated).

Transistor M3 has one source/drain terminal coupled to the mach line ML and another source/drain terminal coupled to a four-transistor circuit formed by transistors M1, M1#, M2, and M2#. The gate of transistor M3 is coupled to a register M, which stores a mask value. The register M and transistor M3 are present when CAM cell 100 is a ternary CAM (TCAM) cell. TCAM cells permit the search expression to include "don't care" bits, while binary CAMs enforce a match/no-match evaluation of every bit. If CAM cell 100 were a binary CAM, transistor M3 and register M would not be present and the source/drain terminals of transistor M2 and M2# illustrated as being coupled to a source/drain terminal of transistor M3 would instead be coupled directly to the match line ML.

Transistors M1, M1#, M2, and M2# form a comparison circuit. The gates of transistors M2, M2# are respectively coupled to search data lines SD and SD#. The search data is placed on the line SD while the complement of the search data is placed on the line SD#. Similarly, the logical value stored at node D is coupled to the gate of transistor M1 while the complement of that logical value stored at node D#is coupled to the gate of transistor M1#. In this manner, the comparison structure will pull the match line ML voltage from its precharged level to ground if and only if the search data on line SD matches the data stored at node D or the complement of the search data on line SD# matches the complement of the data stored at node D, assuming that transistor M3 is conducting. If transistor M3 is not conducting, the match line ML potential will remain at its precharged level.

When a memory device is manufactured, it must be tested. Although testing is time consuming and costly, testing is required to identify errors in the device. If errors are not identified, the use of the memory device can corrupt data. In addition to error detection, an ideal test should also be able to inform the tester as to which portion of a CAM cell is defective. If many defects are isolated to a same problem area, the data can form the basis of improving the device fabrication process. Accordingly, there is a need for a method to efficiently test CAM cells in a CAM device and to identify which component of a defective CAM cell failed.

SUMMARY OF THE INVENTION

The invention is directed to a method for testing a CMOS ternary content addressable memory (TCAM) device that has redundant CAM rows and columns. The method includes a match line test to identify stuck match lines, followed by a walking "1" pattern across the columns to identify weak pull downs (from the match line to ground), and is followed by a row-by-row match test. If stuck matched lines are identified then those lines are masked preventing them from participating in priority encoding and the defective row is replaced by a redundant CAM row, in case redundant resources are available. During the row-by-row match test, a failed CAM cell can be repaired or the row associated with the failed CAM cell can be disabled. Additionally, individual CAM cells that are identified as being defective can be further tested to identify which component of the CAM cell failed.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 1:
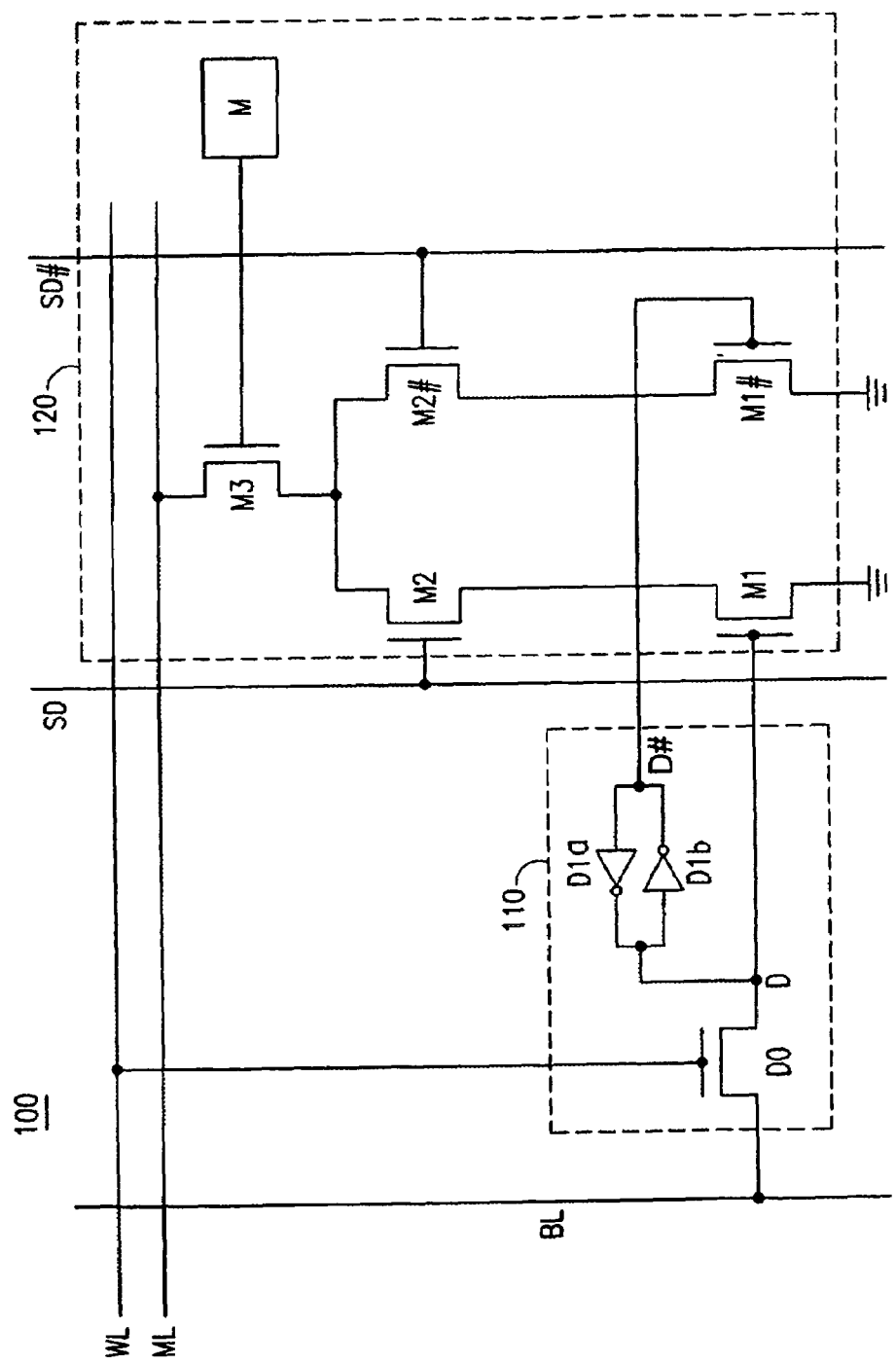
FIG. 1 is a circuit diagram of a conventional CAM cell.
Figure 2:
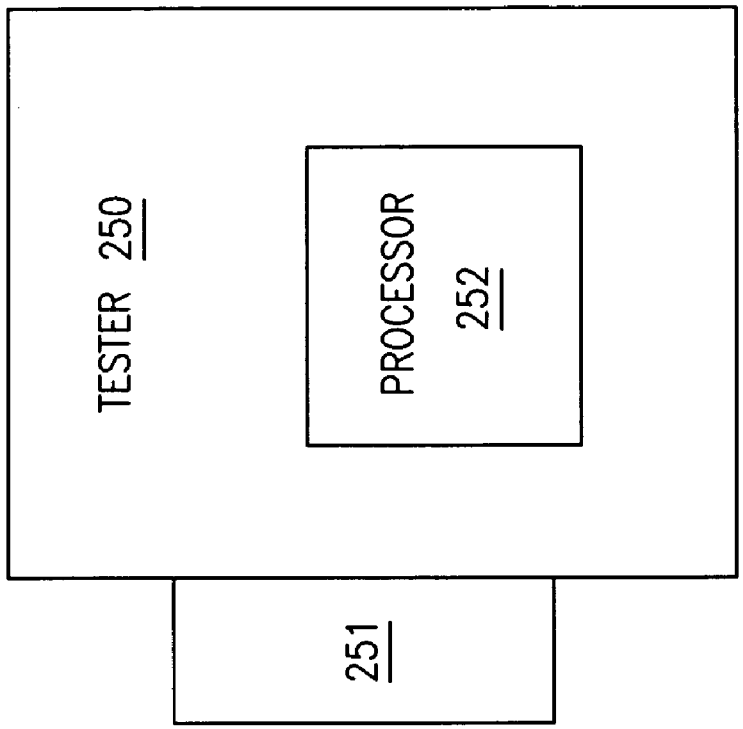
FIG. 2 is a block diagram of a CAM device incorporating the CAM cell of FIG. 1.
Figure 2:
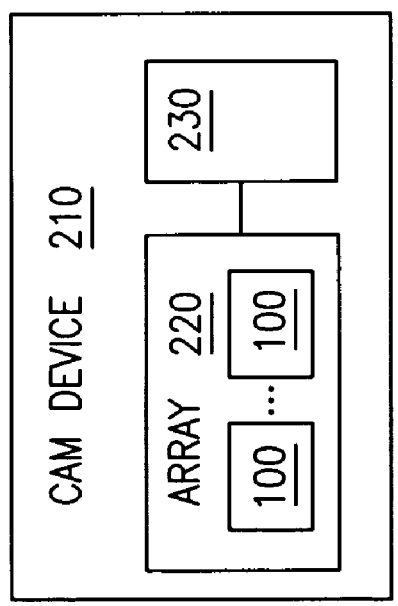

Now referring to the drawings, where like reference numerals designate like elements, there is shown in FIG. 2 a CAM device 210 and a tester 250. The CAM device 210 includes at least one memory array 220. Each array 220 has a plurality of CAM cells 100 (FIG. 1). The CAM device 210 also includes a control circuit 230 for operating the CAM device 210 and for interfacing with external devices. The tester 250 includes an interface 251 for communicating with the CAM device 210. The tester 250 further includes a processor 252, which can execute a series of tests on the CAM device 210 as described below with reference to FIGS. 3–5, 6A, and 6B. The tester 250 tests the device 210 by placing the device 210 into a test mode and then executing the below described procedure. The device 210 may be placed into test mode in a variety of ways which are well known, such as asserting a signal on a test mode enable pin (such pins are typically made non accessible after the device 210 has been tested) or placing the device 210 into the test mode using an instruction. The invention is not be limited by the manner in which the device 210 is placed into test mode.

Figure 3:
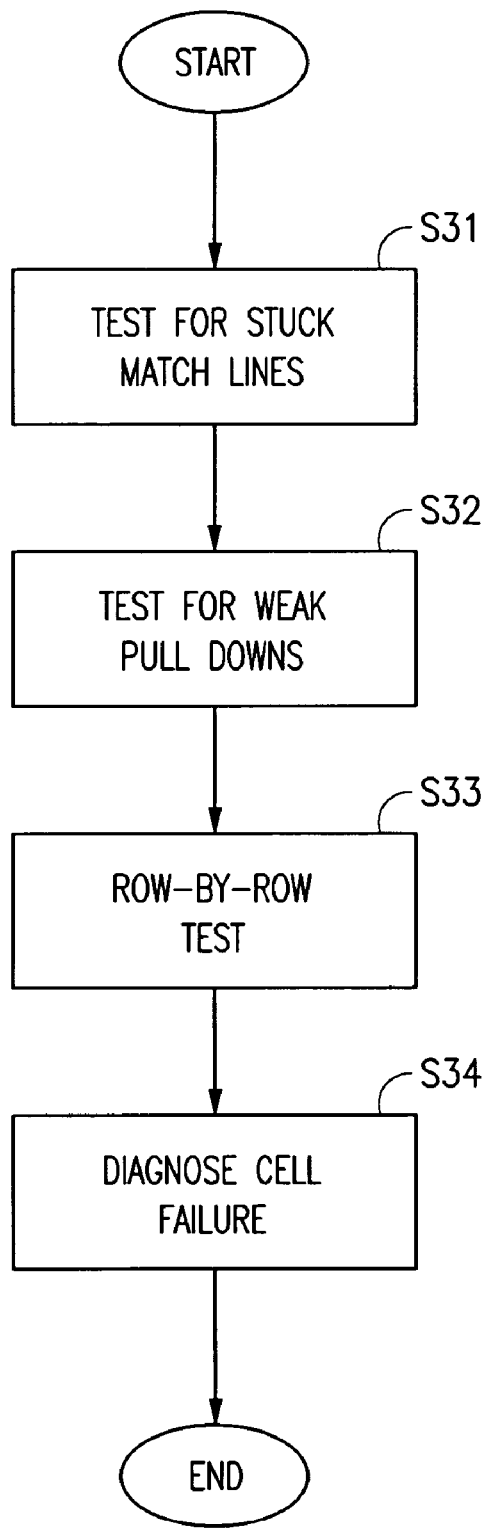
FIG. 3 is a flowchart illustrating the testing method of an exemplary embodiment of the invention.

FIG. 3 is a high level flowchart illustrating the test method of an embodiment of the invention. The tester 250 executes each of the below described steps by sending an appropriate signal to the CAM device 210. At step S31, the CAM device 210 is tested for stuck match lines (described in more detail below). Execution then continues at step S32, where weak pull-down lines are identified (described in more detail below). At step S33, a row-by-row test is executed to ensure each location in the CAM device 210 can be written and read correctly (described in more detail below). The stuck match line test and weak pull-down line tests are executed first in order to identify faulty match lines and pull-down lines, which if not accounted for at the beginning of the testing procedure can cause later tests to return false results. Finally, at step S34, each defective cell identified can be further analyzed under a fault model to determine which component of the cell failed.

In the following discussion we use the term 1-pattern and 0-pattern and these patterns are described as follows. The patterns can be of various forms depending upon the physical organization of the CAM cells and the coupling faults that are being exercised. The simplest 1-pattern will be of the form (111111. . . ) when there is no consideration of the coupling faults or for physical organization. When the logical to physical organization is the same then a pattern applied is a checkered board pattern where the alternate bits are compliment of each other, the pattern is of the form (01010101 . . . ). When there is column muxing the logical checkered board is so arranged so that we have physically a pattern where the a bit is physically surrounded by its compliment. A 0-pattern is the bit wise compliment of a 1-pattern.

Figure 4:
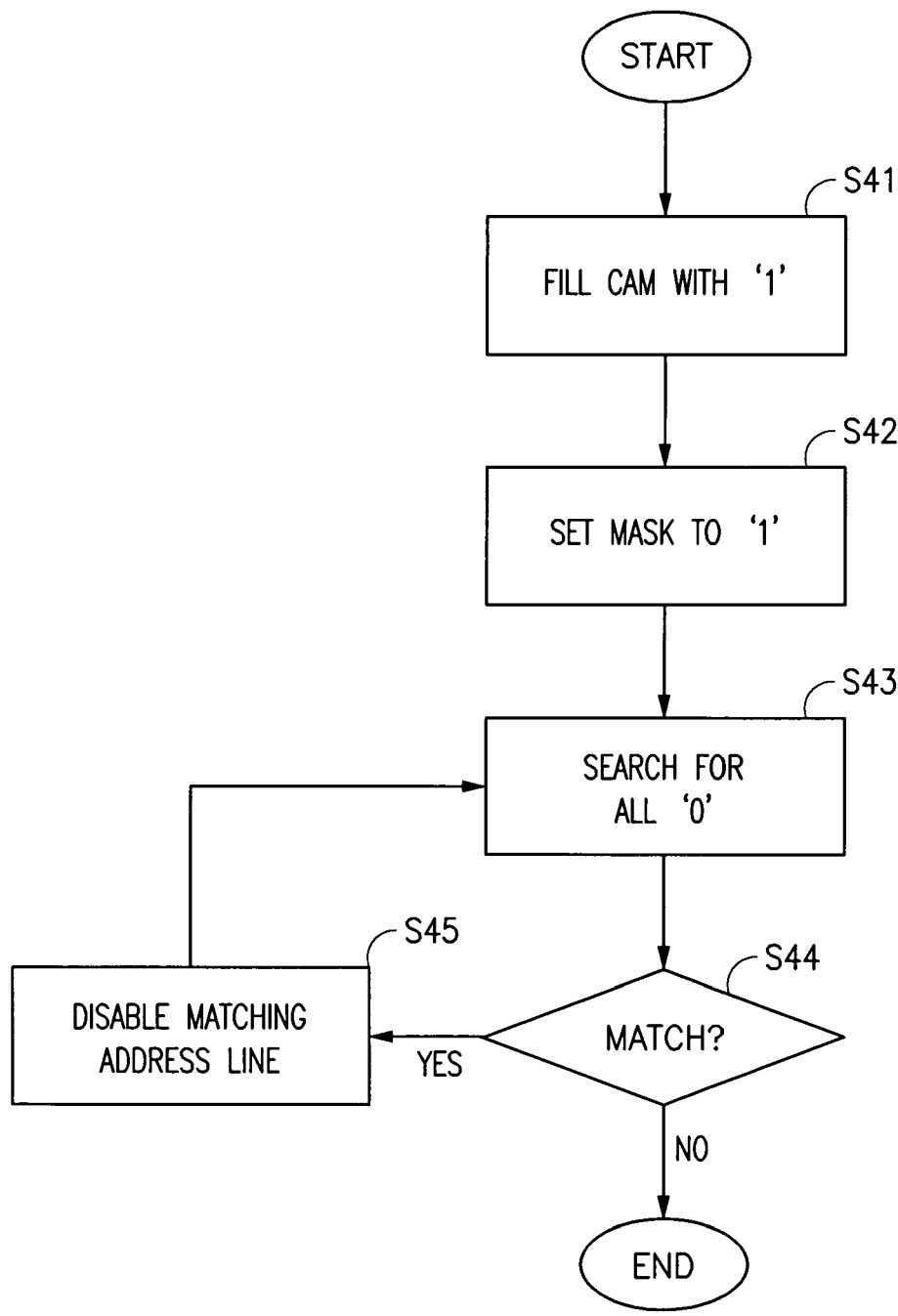
FIG. 4 is a flowchart illustrating a test for identifying stuck match lines according to an embodiment of the invention.

FIG. 4 is a flowchart illustrating an exemplary stuck match line test S31 according to an embodiment of the invention. The objective of this test is to identify and mask for any stuck match lines to remove the stuck match lines from the CAM and replace them with a redundant match row. The test S31 begins at step S41, where the data storage location 110 of each CAM cell 100 is written with a 1-pattern. Execution continues at step S42, where the search mask M of each is set to a not mask state (to consider every cell to participate in match). (If device 210 is a binary CAM, there is no mask bit, so step S42 would not be performed. Rather, execution would continue at step S43 after S41.)

This ensures that every CAM cell 100 will participate in the search by enabling the comparison portion 120 of each CAM cell 100 to pull down its associated match line in case of a match. At step S43, the CAM cell 100 is searched using a 0-pattern search data pattern. At step S44, an inquiry is made to see if there were any matches. In a correctly operating device 210, there should be no matches since step S41 set every data location to a logical one and the search data contained zeros. Thus, if there are no matches, the test completes. A match is an indication of a faulty match line. If there are multiple faulty match lines then the highest priority matched line will be the match address. The address line associated with the matching entry is therefore disabled (S45). If there is a redundant match line, it can be remapped to replace of the disabled match line. After step S45, execution resumes at step S43. Thus, steps S43, S44, and S45 are repeatedly performed in a loop until the test S31 ends with no matches or until all redundant resources are exhausted, when the CAM is declared as unrepairable. This process can be repeated with the CAM filled with 0-pattern and a 1-pattern as the match pattern. This pattern though not strictly necessary will be useful if the stuck match lines are sensitive to the patterns. The further process flows assumes that there is no 0-pattern was applied. At the end of the process therefore the memory will be left with a 1-pattern.

Figure 5:
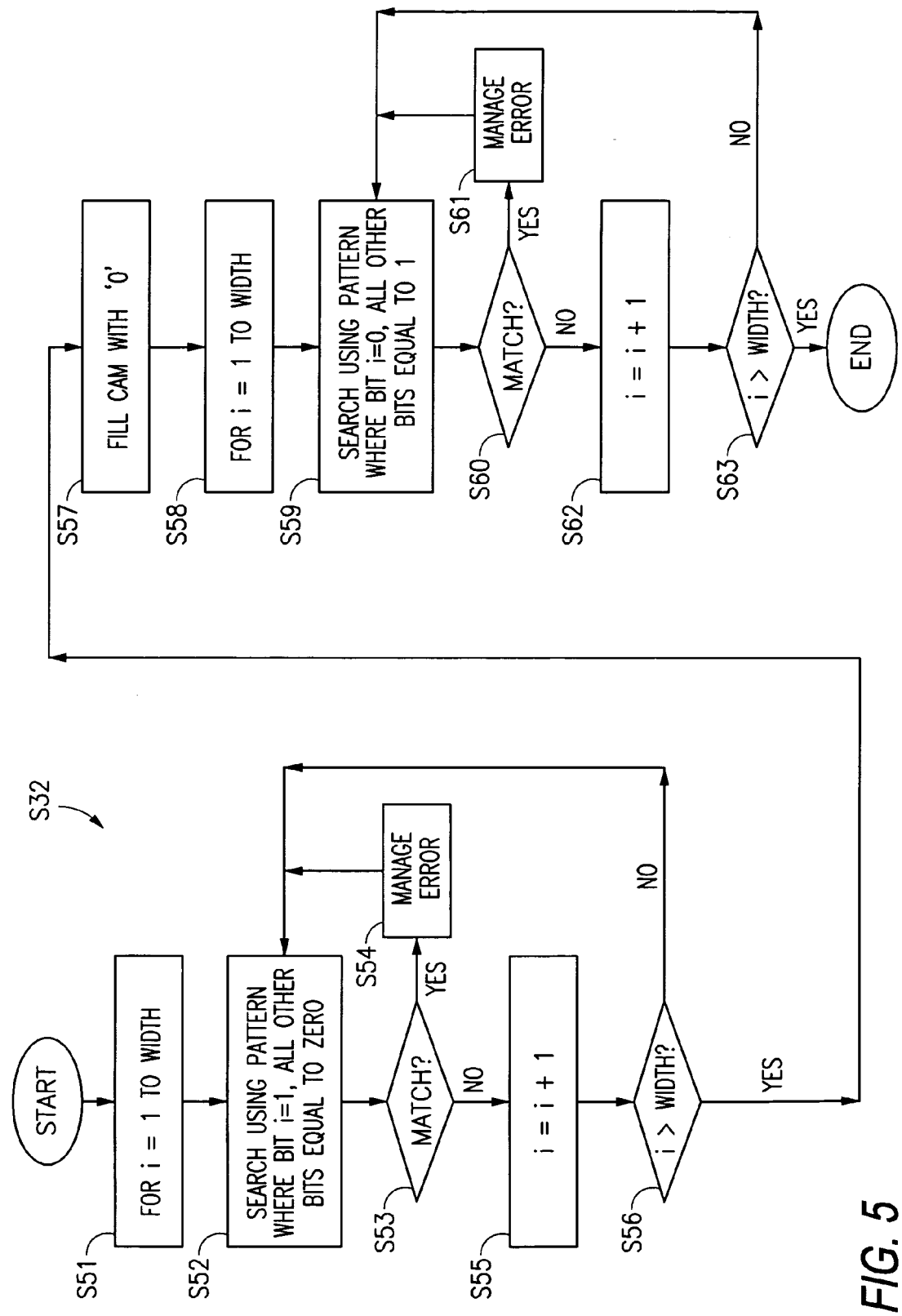
FIG. 5 is a flowchart illustrating a test for identifying weak pull downs between the match line and ground according to an embodiment of the invention.

FIG. 5 is a flowchart illustrating the weak pull down test S32 according to an embodiment of the invention. The objective of this test is to identify and eliminate from use in the CAM device 210 any defective (i.e., weak) pull down lines (i.e., conductive paths from the match line to ground). As can be seen from FIG. 3, this test is intended to be executed after the stuck match line test shown in FIG. 4 and, thus, assumes that each data storage location 110 in the CAM device 210 is set to 1-pattern and each mask M should also be set to unmasked (which is the state the cells 100 of the CAM device 210 were set to by the stuck match line test S31.)

The weak pull down test S32 begins at step S51, which, in cooperation with steps S55 and S56 sets up a for-loop iterating through steps S52–54, as described below. The index i is set to one during the first iteration and the loop terminates when i is incremented such that it exceeds the width of a word in the CAM device 210. At step S52, a search is performed using a search pattern. The search pattern is constructed so that each bit in the search pattern is the compliment of the corresponding 1-pattern, except for bit-i, which is different and is set to equal as corresponding pattern i. This pattern will be referred to as Walking-1 pattern. At step S53, the search results are examined to determine whether there is a match. If a match was detected, the method S32 has detected an error and the error is managed in step S54.

An error may be managed by repairing the matched i-th address bit if the CAM device 210 has sufficient redundant resources to affect a repair. Alternatively, the defective row may be disabled. Additionally, a record of the failure may be maintained by the tester 250. After the error has been managed in step S54, execution resumes at S52. The index i has not been incremented so that any steps taken in step S54 to manage the error is now tested to ensure that the error has been properly processed.

If no match was detected in step S53, the index i is incremented by one in step S55. If at S56 the index i is not greater than the width of the CAM words, then an iteration is completed and the process loops to step S52. If at S56 the index i is greater than the width of the CAM words, then the loop has completed all its iterations and execution continues at step S57.

At step S57, the CAM is written so that each CAM cell stores 0-pattern. The mask, value, previously set to one in step S42 if the device 210 is a ternary CAM, is left unchanged. As before, if the device 210 is a binary CAM, there will be no mask.

Steps S58, S62, and S63 form a for-loop much like steps S51, S55, and S56, as previously described. Execution begins with a first iteration at step S59, where a search is executed with a search expression set to have each bit compliment of 0-pattern except for bit-i, which is equal to the bit i. This pattern will be referred to as a Walking-0 pattern. In step S60, if a match is found there is an error and the error is managed by executing step S61. Step S61 is identical to step S54 (previously described). If no match is detected at 560, the for-loop continues with steps S62 and S63, which operate similarly to steps S55 S56. The end of execution of the for-loop comprising steps S58, S62, and S63 ends the weak pull down test S32.

Figure 6A:
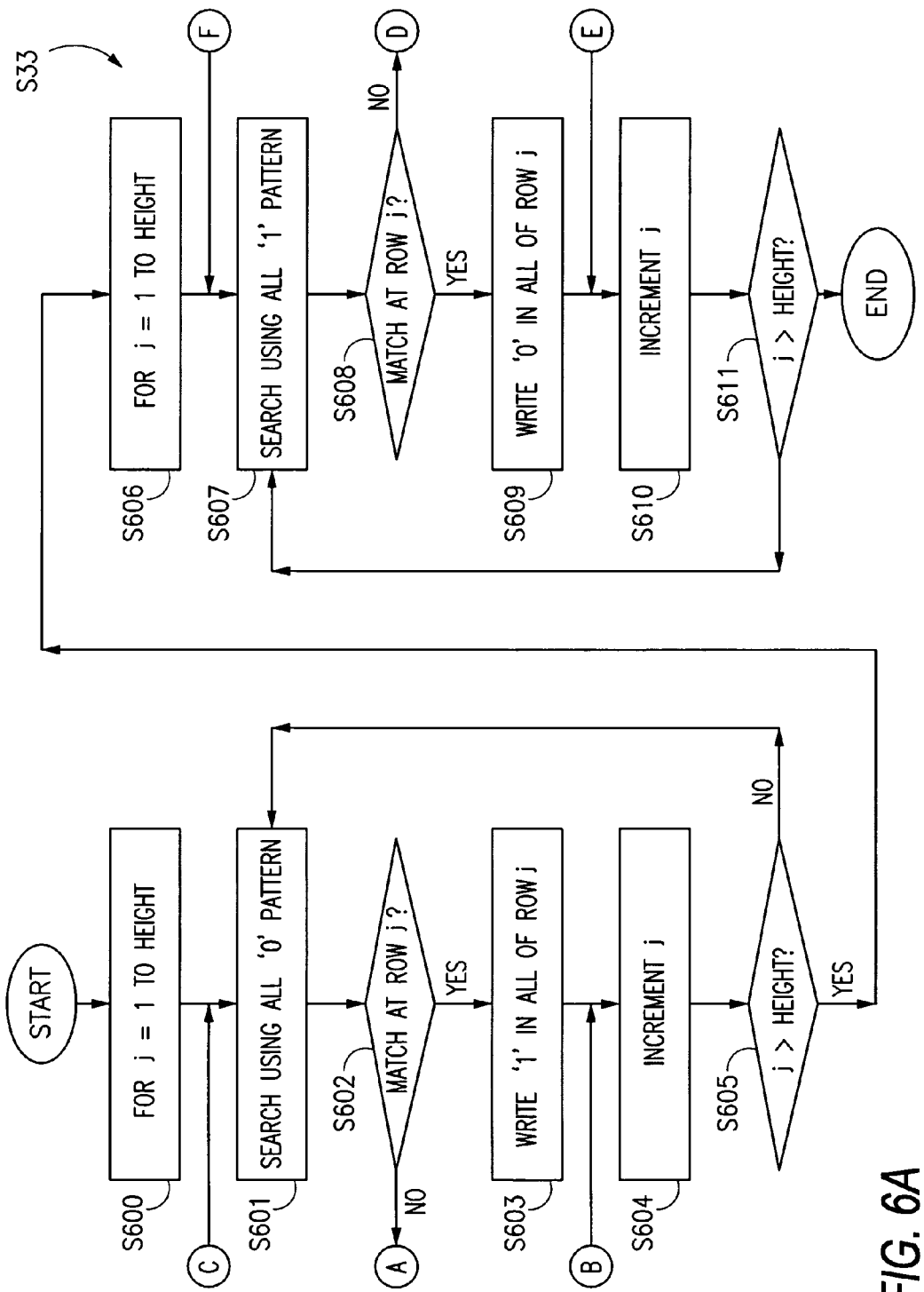
FIGS. 6A and 6B are flowcharts illustrating the row-by-row match test according to an embodiment of the invention.
Figures 1, 6B:
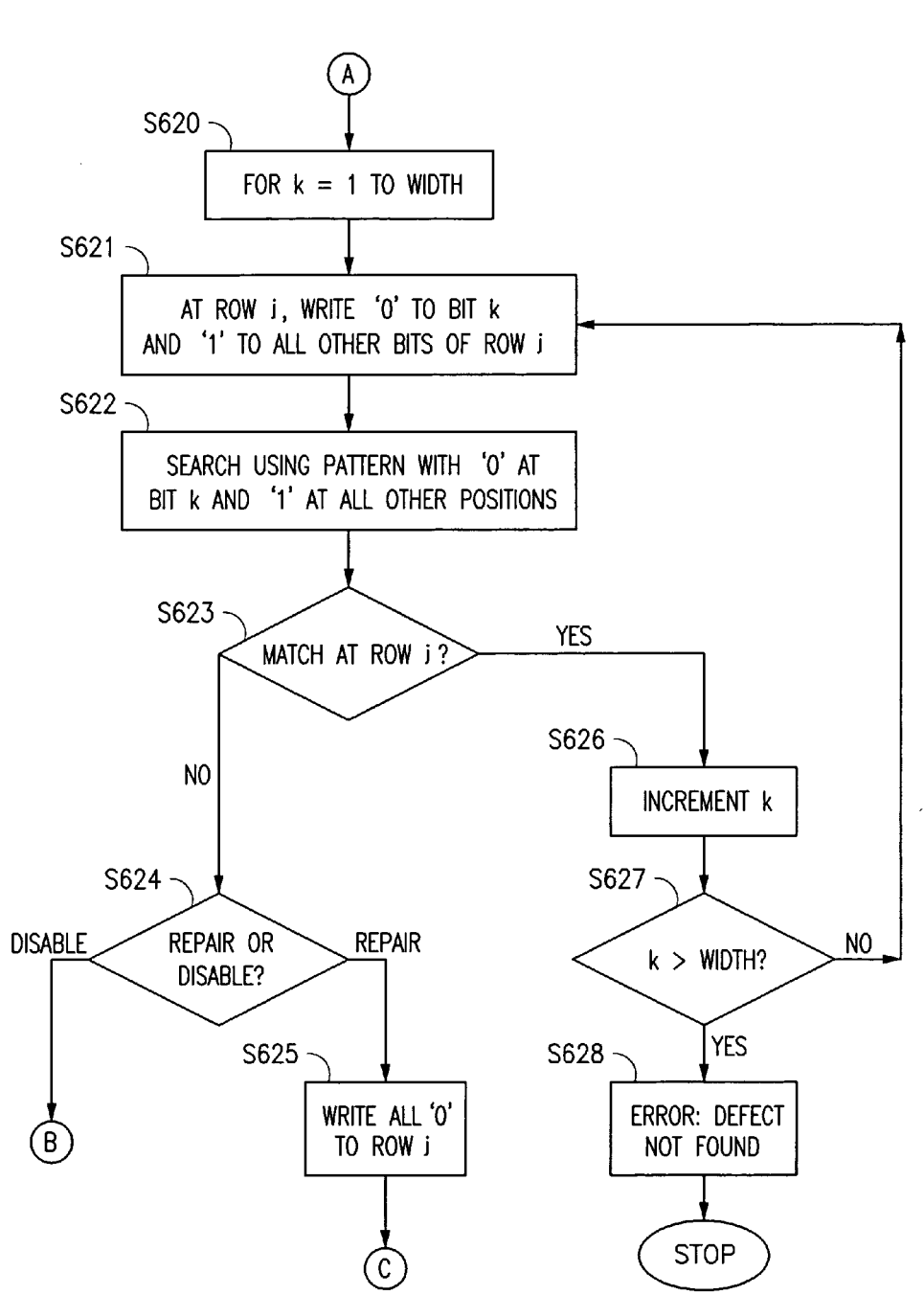
Figures 2, 6B:
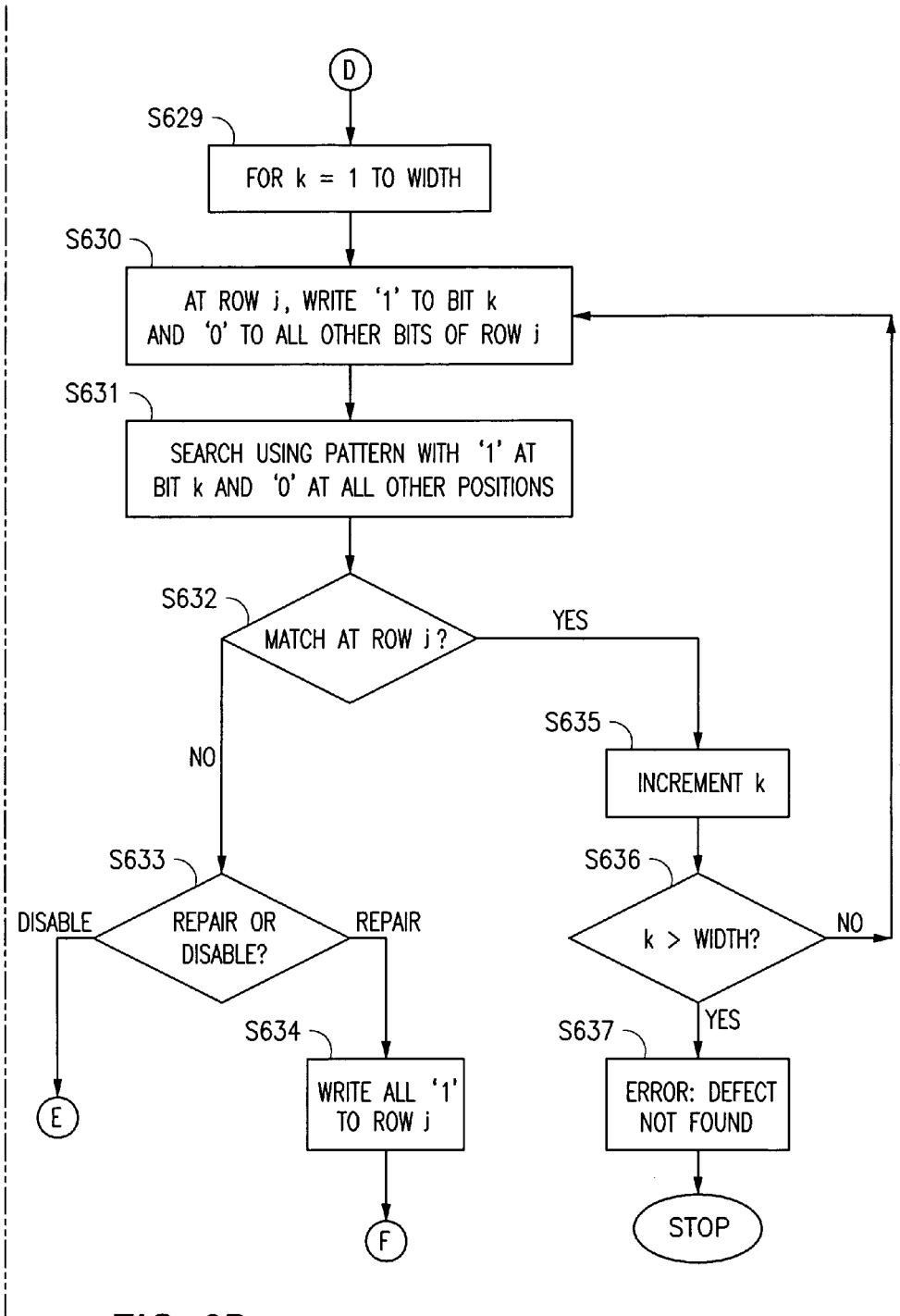

FIGS. 6A and 6B are flowcharts illustrating a row-by-row test S33 according to an embodiment of the invention. The test S33 begins at step S600, which in combination with steps S604 and S605 form a for-loop iterating loop index j from one to height, the number of rows in the CAM device 210. Steps S601–S603 are the steps which are repated in the loop. In step S601, a search is performed using a search pattern which has 0-pattern values. In step S602, an inquiry as to whether a match was reported at row j is made. If no match was found, execution jumps to step S620. However, if there is a match, execution continues at step S603. Step S603 writes 1-pattern into all portions of row j. At step S604, the loop index j is incremented. At step S605, the value of the index j is check against the height parameter. If the index j has not yet exceeded the height parameter, execution resumes at step S601. Otherwise, execution continues at step S606.

Steps S606–S611 are similar to steps S600–S605. Step S606, in combination with steps S610 and S611 form a for-loop iterating loop index j from one to height. In step S607, a search is performed using a 1-pattern search pattern which has all one values. In step S608, an inquiry is made as to whether there is a match at row j. If not, execution continues at step S629. However, if there is a match, execution continues at step S609. Step S609 writes a 0-pattern into all portions of row j. At step S610, the loop index j is incremented. At step S611, the value of index j is checked against the height parameter. If index j has not yet exceeded the height parameter, execution resumes at step S607. Otherwise, the test S33 has completed.

When execution jumps to step S620 from step S602 (FIG. 6A) it is an indication that an error has been detected. Steps S620–S628 form a more detailed error analysis and handling routine. At step S620, a for-loop in cooperation with steps S626 and S627 is established, iterating loop counter k. (This loop is nested within the for-loop using loop counter j at steps S600, S604, and S605 of FIG. 6A.) At step S621, the test S33 writes a pattern into row j which has zero at bit-k and one at every other bit position. If the device 210 is a ternary CAM, the mask M is set so that M=1 for bit-k and M=0 for all other bits in row j. At step S622, the test S33 performs a search using a pattern Walking-$0_k$ At S623 the test S33 determines whether there is a match at row j. If so, counter k is incremented at step S626. At step S627 a check is made to see whether k is greater than width. If k is not greater than width, then execution continues at step S621. If k is greater than width, the test S33 failed to find an error we know which exists (S628). Execution therefore terminates.

If at step S623 there was no match at row j, the test S33 located the k-th bit in row j which is erroneous. At step S624 the test S33 decides whether to repair (e.g., remap) row-j, column-k, in the CAM device 210. If a repair is performed, execution continues at step S625, which writes a pattern of all zeros to row j. Execution then transfers to step S601. If row j is disabled, execution resumes at step S604 (FIG. 6A).

When execution jumps to step S629 from step S608 (FIG. 6A), it is an indication that an error has been detected. Steps S629–S637 form a more detailed error analysis and handling routine. At step S629, a for-loop in cooperation with steps S635 and S636 is established, iterating loop counter k. (This loop is nested within the for-loop using loop counter j at steps S606, S610 and S611 in FIG. 6A). At the S630, a pattern is written into row j which has one at bit-k and a zero at every other bit position. If the device 210 is a ternary CAM, the mask M is set so that M=1 for bit-k and M=0 for all other bits in row j. At step S631, a search using Walking-1 pattern is initiated. In step S632 it is determined whether there is a match at row j. If there is a match, k is incremented at step S635. The counter k is then checked to see if k is greater than width at step S636. If not, execution continues at step S630. If k is greater than width, then the test S33 has failed to find an error known to exist (S637). Execution therefore terminates.

If at step S632, there is no match at row j, the test S33 has located the k-th bit in row j which is erroneous. At step S633, it is decided whether to repair bit k in row j or to disable row j. If it is decided to disable row j, execution resumes at step 610. If at S633 it is decided to repair bit k, the test S33 writes all ones to row j. Execution then transfers to step 607.

The above described processing can be used to test each cell 100 of the CAM device 210. During the error handling process, and more specifically, after an error has been detected but before the bit having the error is repaired, or the row having the error is remapped, a more detailed analysis of why the cell 100 has failed can be made using Table 1. Referring also to FIG. 1, the "Fault" column of Table 1 identifies transistor or line faults by name. In the case of transistor faults, the open or short fault condition is also identified. Each of these conditions can be tested by placing the indicated signals on the storage portion 110 (for D and D#), mask register M, and search data lines SD, and SD#. The results are determined by reading the state of the match line ML.

For example, referring to the first row under "Fault" (in Table 1), the test of the match line ML is performed by setting the mask M to zero and reading the associated match line. If the match line is zero, there is a fault with the match line ML. If the match line is set to one, then the match line ML is good (i.e., no error). Now referring to the fourth row (under column "Fault"), the test for "M1 open," if the indicated data, mask, and search data signals were asserted as listed in Table 1, and if the match line ML value is zero, Table 1 indicates that transistor M1 does not have an open fault. However, if the match line value was instead a one, Table 1 indicates that the transistor M1 has an open fault.

By using the conditions listed in Table 1, each faulty memory cell can be tested to identify some of the potential causes for failure. This data may help production engineers to fine tune the production process to avoid the identified errors.

TABLE 1

CAM Cell Fault Modeling

| Fault | D | D# | M | SD | SD# | ML Good | ML Fail |
|---|---|---|---|---|---|---|---|
| ML | X | X | 0 | X | X | 1 | 0 |
|  | 0 | 1 | X | 1 | 0 |  |  |
|  | 1 | 0 | X | 0 | 1 |  |  |
|  | 1 | 0 | 1 | 1 | 0 | 0 | 1 |
|  | 0 | 1 | 1 | 0 | 1 |  |  |
| SD | 1 | 0 | 1 | 1 | 0 | 0 | 1 |
|  | 1 | 0 | 1 | 0 | 1 | 1 | 0 |
| SD# | 0 | 1 | 1 | 0 | 1 | 0 | 1 |
|  | 0 | 1 | 1 | 1 | 0 | 1 | 0 |
| M1 open | 1 | 0 | 1 | 1 | 0 | 0 | 1 |
| M1 short | 0 | 1 | 1 | 1 | 0 | 1 | 0 |
| M1# open | 0 | 1 | 1 | 0 | 1 | 0 | 1 |
| M1# short | 1 | 0 | 1 | 0 | 1 | 1 | 0 |
| M2 open | 0 | 1 | 1 | 0 | 1 | 0 | 1 |
| M2 short | 1 | 0 | 1 | 1 | 0 | 1 | 0 |
| M2# open | 0 | 1 | 1 | 0 | 1 | 0 | 1 |
| M2# short | 0 | 1 | 1 | 1 | 0 | 1 | 0 |
| M3 open | 1 | 0 | 1 | 1 | 0 | 0 | 1 |
|  | 0 | 1 | 1 | 0 | 1 |  |  |
| M3 short | 1 | 0 | 0 | 1 | 0 | 1 | 0 |
|  | 0 | 1 | 0 | 0 | 1 |  |  |

Thus, the present invention describes a methodology for testing CAM memory cells in a cam device. A match line test is first performed to identify and manage stuck match lines. Then pull-down test is performed to identify and manage faulty pull-down lines. Once the mach lines and pull down lines are assumed to be functional, a row-by-row test is conducted. When a cell is identified as having failed, Table 1, above provides a mapping of signal states whereby reading the match line associated with the CAM cell can be used to identify the type of error.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method for testing a plurality of content addressable memory (CAM) cells in a CAM device, comprising the steps of:
   (a) testing said CAM device to identify stuck match lines by conducting a 1-pattern or 0-pattern search match line test and repairing or disabling row addresses for the CAM device which corresponds to rows having stuck match lines;
   (b) testing said CAM device to identify defective pull down lines using a walking 1 or 0 match pattern and repairing or disabling cells at bit positions identified as having defective pull down lines;
   (c) testing each CAM cell in said CAM device to locate a faulty CAM cell; and
   (d) for each located faulty CAM cell identified in step (c), diagnosing a cause of fault for said faulty CAM cell by applying at least one signal to said faulty CAM cell and reading a state of the match line associated with said faulty cell.

2. The method of claim 1, wherein step (c) is performed after both steps (a) and (b).

3. The method of claim 1, wherein said step of applying at least one signal comprises:
setting a mask value of said faulty CAM cell to a logical zero; and
identifying a faulty match line if said match line is set to logical zero.

4. The method of claim 1, wherein said step of applying at least one signal comprises:
setting a storage location of said faulty CAM cell to a logical zero;
setting a search data line of said faulty CAM cell to a logical one;
setting a complement search data line of said faulty CAM cell to a logical zero; and
identifying a faulty match line if said match line is set to logical zero.

5. The method of claim 1, wherein said step of applying at least one signal comprises:
setting a storage location of said faulty CAM cell to a logical one;
setting a search data line of said faulty CAM cell to a logical zero;
setting a complement search data line of said faulty CAM cell to a logical one; and
identifying a faulty match line if said match line is set to logical zero.

6. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical zero;
setting a complement search data line of said faulty CAM cell to a logical one; and
identifying a faulty match line if said match line is set to logical one.

7. The method of claim 1, wherein said step of applying at least one signal comprises:
setting a storage location of said faulty CAM cell to a logical one;
setting a mask value of said faulty CAM cell to a logical one;
setting a search data line of said faulty CAM cell to a logical one;
setting a complementary search data line of said faulty CAM cell to a logical zero; and
identifying a faulty search data line if said match line is set to logical one.

8. The method of claim 1, wherein said step of applying at least one signal comprises:
setting a storage location of said faulty CAM cell to a logical one;
setting a mask value of said faulty CAM cell to a logical one;
setting a search data line of said faulty CAM cell to a logical zero;
setting a complementary search data line of said faulty CAM cell to a logical one; and
identifying a faulty search data line if said match line is set to logical zero.

9. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical zero;
setting a complementary search data line of said faulty CAM cell to a logical one; and
identifying a faulty complement search data line if said match line is set to a logical one.

10. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical one;
setting a complementary search data line of said faulty CAM cell to a logical zero; and
identifying a faulty complement search data line if said match line is set to logical zero.

11. The method of claim 1, wherein said step of applying at least one signal comprises:
setting a storage location of said faulty CAM cell to a logical one;
setting a mask value of said faulty CAM cell to a logical one;
setting a search data line of said faulty CAM cell to a logical one;
setting a complementary search data line of said faulty CAM cell to a logical zero; and
identifying an stuck open fault with a transistor having a gate coupled to a data storage node of said CAM cell, if said match line is set to logical one.

12. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical one;
setting a complementary search data line of said faulty CAM cell to a logical zero; and
identifying an short circuit fault with a transistor having a gate coupled to a data storage node of said CAM cell, if said match line is set to logical zero.

13. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical zero;
setting a complementary search data line of said faulty CAM cell to a logical one; and
identifying an stuck open fault with a transistor having a gate coupled to a complement of a data storage node if said match line is set to a logical one.

14. The method of claim 1, wherein said step of applying at least one signal comprises:
setting a storage location of said faulty CAM cell to a logical one;

setting a mask value of said faulty CAM cell to a logical one;
setting a search data line of said faulty CAM cell to a logical zero;
setting a complementary search data line of said faulty CAM cell to is set to a logical one; and
identifying a short circuit fault with a transistor having a gate coupled to a complement of a data storage node, if said match line is set to logical zero.

15. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical zero;
setting a complementary search data line of said faulty CAM cell to a logical one; and
identifying a stuck open fault with a transistor having a gate coupled to a search data line, if said match line, is set to logical one.

16. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical one;
setting a complementary search data line of said faulty CAM cell to a logical zero; and
identifying a short circuit fault with a transistor having a gate coupled to a search data line, if said match line is set to logical one.

17. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical zero;
setting a complementary search data line of said faulty CAM cell to a logical one; and
identifying a stuck open fault with a transistor having a gate coupled to a complementary search data line, if said match line is set to one.

18. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical one;
setting a complementary search data line of said faulty CAM cell to a logical zero; and
identifying a short circuit fault with a transistor having a gate coupled to a complementary search data line, if said match line is set to logical zero.

19. The method of claim 1, wherein said step of applying at least one signal comprises:
setting a storage location of said faulty CAM cell to a logical one;
setting a mask value of said faulty CAM cell to a logical one;
setting a search data line of said faulty CAM cell to a logical one; and
setting a complementary search data line of said faulty CAM cell to a logical zero;
identifying a stuck open fault with a transistor having a gate coupled to a mask register, if said match line is set to logical one.

20. The method of claim 1, wherein said step of applying at least one signal comprises:
setting a storage location of said faulty CAM cell to a logical zero;
setting a mask value of said faulty CAM cell to a logical one;
setting a search data line of said faulty CAM cell to a logical zero;
setting a complementary search data line of said faulty CAM cell to a logical one; and
identifying a stuck open fault with a transistor having a gate coupled to a mask register, if said match line is set to logical one.

21. The method of claim 1, wherein said step of applying at least one signal comprises:
setting a storage location of said faulty CAM cell to a logical one;
setting a mask value of said faulty CAM cell to a logical zero;
setting a search data line of said faulty CAM cell to a logical one;
setting a complementary search data line of said faulty CAM cell to a logical zero; and
identifying a short circuit fault with a transistor having a gate coupled to a mask register, if said match line is set to logical zero.

22. The method of claim 1, wherein said step of applying at least one signal comprises:
setting a storage location of said faulty CAM cell to a logical zero;
setting a mask value of said faulty CAM cell to a logical zero;
setting a search data line of said faulty CAM cell to a logical zero;
setting a complementary search data line of said faulty CAM cell to a logical one; and
identifying a short circuit fault with a transistor having a gate coupled to a mask register, if said match line is set to logical zero.

23. A system for testing a CAM device comprising:
an interface for sending and receiving signals from the CAM device; and
a processor, coupled to said interface, for controlling signals that are sent to the CAM device and for reading signals received from the CAM device,
wherein said processor operates said interface to test said CAM device for stuck match lines by conducting a 1-pattern search or 0-pattern search match line test, repairing or disabling row addresses for the CAM device which correspond to rows having stuck match lines; to test said CAM device for defective pull down lines using a walking 1 or 0 match pattern, repairing or disabling cells at bit positions identified as having defective pull down lines; and to test each CAM cell to locate faulty CAM cells; and
wherein for each faulty CAM cell said processor operates said interface to diagnose a cause of fault for each faulty CAM cell by applying at least one signal and reading a state of a match line associated with the faulty CAM cell.

24. The system of claim 23, wherein said processor applies said at least one signal comprises:
  setting a mask value of said faulty CAM cell to a logical zero; and
  identifying a faulty match line if said match line is set to logical zero.

25. The system of claim 23, wherein said processor applies said at least one signal comprises:
  setting a storage location of said faulty CAM cell to a logical zero;
  setting a search data line of said faulty CAM cell to a logical one;
  setting a complement search data line of said faulty CAM cell to a logical zero; and
  identifying a faulty match line if said match line is set to logical zero.

26. The system of claim 23, wherein said processor applies said at least one signal comprises:
  setting a storage location of said faulty CAM cell to a logical one;
  setting a search data line of said faulty CAM cell to a logical zero;
  setting a complement search data line of said faulty CAM cell to a logical one; and
  identifying a faulty match line if said match line is set to a logical zero.

27. The system of claim 23, wherein said processor applies said at least one signal comprises:
  setting a storage location of said faulty CAM cell to a logical zero;
  setting a mask value of said faulty CAM cell to a logical one;
  setting a search data line of said faulty CAM cell to a logical zero;
  setting a complement search data line of said faulty CAM cell to a logical one; and
  identifying a faulty match line if said match line is set to logical one.

28. The system of claim 23, wherein said processor applies said at least one signal comprises:
  setting a storage location of said faulty CAM cell to a logical one;
  setting a mask value of said faulty CAM cell to a logical one;
  setting a search data line of said faulty CAM cell to a logical one;
  setting a complementary search data line of said faulty CAM cell to a logical zero; and
  identifying a faulty search data line if said match line is set to logical one.

29. The system of claim 23, wherein said processor applies said at least one signal comprises:
  setting a storage location of said faulty CAM cell to a logical one;
  setting a mask value of faulty CAM cell to a logical one;
  setting a search data line of said faulty CAM cell to a logical zero;
  setting a complementary search data line of said faulty CAM cell to a logical one; and
  identifying a faulty search data line if said match line is set to logical zero.

30. The system of claim 23, wherein said processor applies said at least one signal comprises:
  setting a storage location of said faulty CAM cell to a logical zero;
  setting a mask value of said faulty CAM cell to a logical one;
  setting a search data line of said faulty CAM cell to a logical zero;
  setting a complementary search data line of said faulty CAM cell to a logical one; and
  identifying a faulty complement search data line if said match line is set to a logical one.

31. The system of claim 23, wherein said processor applies said at least one signal comprises:
  setting a storage location of said faulty CAM cell to a logical zero;
  setting a mask value of said faulty CAM cell to a logical one;
  setting a search data line of said faulty CAM cell to a logical one;
  setting a complementary search data line of said faulty CAM cell to a logical zero; and
  identifying a faulty complement search data line if said match line is set to logical zero.

32. The system of claim 23, wherein said processor applies said at least one signal comprises:
  setting a storage location of said faulty CAM cell to a logical one;
  setting a mask value of said faulty CAM cell to a logical one;
  setting a search data line of said faulty CAM cell to a logical one;
  setting a complementary search data line of said faulty CAM cell to a logical zero; and
  identifying an stuck open fault with a transistor having a gate coupled to a data storage node of said CAM cell, if said match line is set to logical one.

33. The system of claim 23, wherein said processor applies said at least one signal comprises:
  setting a storage location of said faulty CAM cell to a logical zero;
  setting a mask value of said faulty CAM cell to a logical one;
  setting a search data line of said faulty CAM cell to a logical one;
  setting a complementary search data line of said faulty CAM cell to a logical zero; and
  identifying an short circuit fault with a transistor having a gate coupled to a data storage node of said CAM cell, if said match line is set to logical zero.

34. The system of claim 23, wherein said processor applies said at least one signal comprises:
  setting a storage location of said faulty CAM cell to a logical zero;
  setting a mask value of said faulty CAM cell to a logical one;
  setting a search data line of said faulty CAM cell to a logical zero;
  setting a complementary search data line of said faulty CAM cell to a logical one; and
  identifying an stuck open fault with a transistor having a gate coupled to a complement of a data storage node if said match line is set to a logical one.

35. The system of claim 23, wherein said processor applies said at least one signal comprises:
  setting a storage location of said faulty CAM cell to a logical one;
  setting a mask value of said faulty CAM cell to a logical one;
  setting a search data line of said faulty CAM cell to a logical zero;
  setting a complementary search data line of said faulty CAM cell to is set to a logical one; and identifying a short circuit fault with a transistor having a gate coupled to a complement of a data storage node, if said match line is set to logical zero.

36. The system of claim 23, wherein said processor applies said at least one signal comprises:
 setting a storage location of said faulty CAM cell to a logical zero;
 setting a mask value of said faulty CAM cell to a logical one;
 setting a search data line of said faulty CAM cell to a logical zero;
 setting a complementary search data line of said faulty CAM cell to a logical one; and
 identifying a stuck open fault with a transistor having a gate coupled to a search data line, if said match line is set to logical one.

37. The system of claim 23, wherein said processor applies said at least one signal comprises:
 setting a storage location of said faulty CAM cell to a logical zero;
 setting a mask value of said faulty CAM cell to a logical one;
 setting a search data line of said faulty CAM cell to a logical one;
 setting a complementary search data line of said faulty CAM cell to a logical zero; and
 identifying a short circuit fault with a transistor having a gate coupled to a search data line, if said match line is set to logical one.

38. The system of claim 23, wherein said processor applies said at least one signal comprises:
 setting a storage location of said faulty CAM cell to a logical zero;
 setting a mask value of said faulty CAM cell to a logical one;
 setting a search data line of said faulty CAM cell to a logical zero;
 setting a complementary search data line of said faulty CAM cell to a logical one; and
 identifying a stuck open fault with a transistor having a gate coupled to a complementary search data line, if said match line is set to one.

39. The system of claim 23, wherein said processor applies said at least one signal comprises:
 setting a storage location of said faulty CAM cell to a logical zero;
 setting a mask value of said faulty CAM cell to a logical one;
 setting a search data line of said faulty CAM cell to a logical one;
 setting a complementary search data line of said faulty CAM cell to a logical zero; and
 identifying a short circuit fault with a transistor having a gate coupled to a complementary search data line, if said match line is set to logical zero.

40. The system of claim 23, wherein said processor applies said at least one signal comprises:
 setting a storage location of said faulty CAM cell to a logical one;
 setting a mask value of said faulty CAM cell to a logical one;
 setting a search data line of said faulty CAM cell to a logical one;
 setting a complementary search data line of said faulty CAM cell to a logical zero; and
 identifying a stuck open fault with a transistor having a gate coupled to a mask register, if said match line is set to logical one.

41. The system of claim 23, wherein said processor applies said at least one signal comprises:
 setting a storage location of said faulty CAM cell to a logical zero;
 setting a mask value of said faulty CAM cell to a logical one;
 setting a search data line of said faulty CAM cell to a logical zero;
 setting a complementary search data line of said faulty CAM cell to a logical one; and
 identifying a stuck open fault with a transistor having a gate coupled to a mask register, if said match line is set to logical one.

42. The system of claim 23, wherein said processor applies said at least one signal comprises:
 setting a storage location of said faulty CAM cell to a logical one;
 setting a mask value of said faulty CAM cell to a logical zero;
 setting a search data line of said faulty CAM cell to a logical one;
 setting a complementary search data line of said faulty CAM cell to a logical zero; and
 identifying a short circuit fault with a transistor having a gate coupled to a mask register, if said match line is set to logical zero.

43. The system of claim 23, wherein said processor applies said at least one signal comprises:
 setting a storage location of said faulty CAM cell to a logical zero;
 setting a mask value of said faulty CAM cell to a logical zero;
 setting a search data line of said faulty CAM cell to a logical zero;
 setting a complementary search data line of said faulty CAM cell to a logical one; and
 identifying a short circuit fault with a transistor having a gate coupled to a mask register, if said match line is set to logical zero.

44. A system for testing a CAM device comprising:
 means for testing for stuck match line within the device by conducting a 1-pattern or 0-pattern search match line test and repairing or disabling row addresses for the CAM device which corresponds to rows having stuck match lines;
 means for testing for defective pull down lines within the device using a walking 1 or 0 match pattern and repairing or disabling cells at bit positions identified as having defective pull down lines;
 means for identifying faulty CAM cells within the device; and
 means for diagnosing faulty CAM cells identified by said identifying means.

* * * * *

UNITED STATES PATENT AND TRADEMARK OFFICE
CERTIFICATE OF CORRECTION

PATENT NO. : 7,219,276 B2
APPLICATION NO. : 10/679266
DATED : May 15, 2007
INVENTOR(S) : Prasad Mantri It is certified that error appears in the above-identified patent and that said Letters Patent is hereby corrected as shown below:

In the Specification, the following errors are corrected:

Column 1, line 46, "indicate" should read --indicates--;

Column 2, line 46, "potential, which" should read --potential, in which--;

Column 4, line 50, "compliment" should read --complement--;

Column 4, line 54, "compliment ... compliment" should read --complement ... complement--;

Column 5, line 15, "replace of the" should read --replace the--;

Column 5, line 25, "that there is no" should read --that no--:

Column 5, line 47, "compliment" should read --complement--;

Column 5, line 62, "is" should read --are--;

Column 6, line 13, "compliment" should read --complement--;

Column 6, line 19, "S55 S56" should read --S55, S56--;

Column 6, line 27, "repated" should read --repeated--;

Column 6, line 35, "check" should read --checked--;

Column 6, line 63, "Walking-$0_k$" should read --Walking-$0_k$.--; and

Column 8, line 33, "Then pull-down" should read --Then a weak pull-down--.

In the Claims, the following errors are corrected:

Claim 11, column 10, line 35, "an stuck" should read --a stuck--;

Claim 12, column 10, line 48, "an short" should read --a short--;

Claim 13, column 10, line 61, "an stuck" should read --a stuck--;

Claim 14, column 11, line 6, "to is set to a" should read --to a--;

UNITED STATES PATENT AND TRADEMARK OFFICE
CERTIFICATE OF CORRECTION

PATENT NO. : 7,219,276 B2
APPLICATION NO. : 10/679266
DATED : May 15, 2007
INVENTOR(S) : Prasad Mantri It is certified that error appears in the above-identified patent and that said Letters Patent is hereby corrected as shown below:

Claim 32, column 14, line 29, "an stuck" should read --a stuck--;

Claim 33, column 14, line 42, "an stuck" should read --a stuck--;

Claim 34, column 14, line 55, "an stuck" should read --a stuck--; and

Claim 35, column 14, line 67, "to is set to a" should read --to a--.

Signed and Sealed this

Eighteenth Day of September, 2007

JON W. DUDAS
*Director of the United States Patent and Trademark Office*